US 8,710,679 B2
(45) Date of Patent: Apr. 29, 2014

(12) United States Patent
Andoh et al.

(10) Patent No.: US 8,710,679 B2
(45) Date of Patent: Apr. 29, 2014

(54) ELECTRODE STRUCTURE AND ITS MANUFACTURING METHOD, AND SEMICONDUCTOR MODULE

(75) Inventors: Setsuo Andoh, Kumagaya (JP); Fumitake Taniguchi, Tottori (JP)

(73) Assignee: Hitachi Metals, Ltd., Tokyo (JP)

( * ) Notice: Subject to any disclaimer, the term of this patent is extended or adjusted under 35 U.S.C. 154(b) by 318 days.

(21) Appl. No.: 12/746,056

(22) PCT Filed: Dec. 4, 2008

(86) PCT No.: PCT/JP2008/072019
§ 371 (c)(1),
(2), (4) Date: Jun. 3, 2010

(87) PCT Pub. No.: WO2009/072544
PCT Pub. Date: Jun. 11, 2009

(65) Prior Publication Data
US 2010/0258954 A1    Oct. 14, 2010

(30) Foreign Application Priority Data
Dec. 4, 2007    (JP) ................................. 2007-313535

(51) Int. Cl.
*H01L 23/48*    (2006.01)
*H01L 23/58*    (2006.01)
*H01L 29/40*    (2006.01)

(52) U.S. Cl.
USPC .................... 257/784; 257/741; 257/E23.024

(58) Field of Classification Search
USPC ........................................................ 257/784
See application file for complete search history.

(56) References Cited

FOREIGN PATENT DOCUMENTS

| JP | 2005-72282 A | 3/2005 |
| JP | 2006-196648 A | 7/2006 |
| JP | 2006-339609 A | 12/2006 |

*Primary Examiner* — Fernando L Toledo
*Assistant Examiner* — Valerie N Newton
(74) *Attorney, Agent, or Firm* — Birch, Stewart, Kolasch & Birch, LLP

(57) ABSTRACT

There is a highly reliable semiconductor module having a satisfactory bonding strength in the electrical bonded portion. In the semiconductor module 10, a semiconductor chip 11 is mounted on a circuit board 20. In the circuit board 20, on an insulating ceramic substrate 21 is formed a metal circuit plate 22 on which the semiconductor chip 11 is implemented. The semiconductor chip 11 and metal circuit plate 22 are connected with each other by an aluminum bonding wire 23. In the connected portion between the metal circuit plate 22 and bonding wire 23, a coating layer 24 for excellent conjunction therebetween is mounted. The coating layer 24, as shown in an enlarged diagram, is made up of a nickel (Ni) layer 241, a P-distributed palladium (Pd) layer 242, and an Au layer 243 in increasing order. To the P-distributed Pd layer 242 is added P (phosphorous) and, the P concentration on the Ni layer 241 is higher than that on the Au layer side 243.

19 Claims, 9 Drawing Sheets

ELECTRODE STRUCTURE AND ITS MANUFACTURING METHOD, AND SEMICONDUCTOR MODULE

TECHNICAL FIELD

The present invention relates to an electrode structure on which wire bonding or the like is to be performed and to a method of manufacturing the electrode. The present invention also relates to a circuit board using the electrode structure and a semiconductor module on which a semiconductor chip is mounted.

BACKGROUND TECHNOLOGY

For example, as an inverter for an electric motor vehicle, a semiconductor module, for example, an IGBT (Insulated Gate Bipolar Transistor) module which enables high voltage and large current operations is used. In such a semiconductor module, a semiconductor chip is bonded to a circuit board having a high electrical insulation property and high mechanical strength. In the circuit board, a metal circuit plate serving as a wiring is formed on an insulating ceramic substrate. The semiconductor chip is mounted on the circuit board and wiring on the semiconductor chip is electrically connected to the metal circuit plate. The electric connection is established by the method using a bonding wire made of aluminum or gold, or by the method using a solder bump or a solder ball.

High reliability is required for the electrical connection. That is, it is necessary that, even in a high temperature environment, mechanical strength for the connection can be kept high and an electrical resistance at a bonded portion can be kept low. An electrode structure in which the above points have been improved is disclosed in Patent Reference 1.

FIG. 8 is a cross-sectional diagram showing a semiconductor module 80 employing the electrode structure and an enlarged diagram showing a cross section of the electrode structure. Here, in the circuit board 90, a metal circuit plate 92 made of cupper (Cu) is formed on a ceramic substrate 91 on which a semiconductor chip 81 is mounted. The semiconductor chip 81 and metal circuit plate 92 are connected with each other by a bonding wire made of aluminum (Al). In a bonded portion between the metal circuit plate and bonding wire 93 is mounted a coating layer 94 for improving the connection therebetween. The coating layer 94, as shown by the enlarged diagram in FIG. 8, is made up of a nickel (Ni) layer 941, a palladium (Pd) layer 942, and a gold (Au) layer 943, which are stacked upward from bottom. A phosphorous (P) layer 941 is added to the Pd layer 942. Each of the Ni layer 941, Pd layer 942, and Au layer 943 is formed by plating.

The bonding wire 93 is, for example, about 100 µm in diameter, and the connection using the bonding wire 93 is performed by ultrasonic bonding. At this time, ultrasonics are applied to the bonding wire 93 in a state where the metal circuit plate 92 (coating layer 94) is adhered with pressure to be bonded.

In the structure described above, an alloy layer is formed at an interface between Au and Al, thus increasing bonding strength between the bonding wire 93 and Au layer 943. Owing to low electrical resistance of the Au layer 943, excellent electrical characteristics can be obtained. Since the alloy is formed also at the interface between Cu and Ni making up the metal circuit plate 92, the bonding strength between the metal circuit plate 92 and Ni layer is high. Au/Pd and Ni/Pd form an alloy and, therefore, bonding strength between the Au layer 943 and Pd layer 942 and between the Pd layer 942 and Ni layer 941 is also large. Therefore, in this structure, adhesion property at each interface is excellent.

In the above structure, Cu or Ni diffused into the Au layer 943 degrades the bonding strength between the bonding wire 93 and Au layer 943. Particularly, this kind of the diffusion occurs in a thermal process such as soldering or molding in which a temperature of 300° C. or higher is applied. The Pd layer 942 plays a role of suppressing the diffusion. Moreover, by doping P to the Pd layer 942, the oxidation of the Ni layer 941 can be suppressed.

Therefore, by performing the wire bonding on the electrode structure, high and stable bonding strength in the wire bonding is obtained and highly reliable semiconductor module can be provided.

Moreover, this electrode structure is used in a voltage controlled signal transmitter, antenna switch, high-frequency amplifier or the like employed in wireless communication devices such as a mobile phone, GPS (Global Positioning System), LAN (Local Area Network) and high frequency modular electronic components obtained by integrating these components. In the high-frequency electronic components, semiconductor elements serving as active elements and electronic devices such as a chip inductor, chip capacitor, and chip resistor are surface-mounted on a ceramic layer stacked substrate internally having an electronic circuit formed by a conductor pattern. The high frequency circuit portion (RF circuit) of the high frequency electronic components handles a high frequency signal of several hundred MHz to several GHz.

FIG. 9 is a cross-sectional view showing a conventional high frequency electronic component. The high frequency electronic component 30 is a high frequency wave amplifier and has at least a multi layer substrate 40 and a semiconductor device 31 and, if necessary, an electronic component 45. The multi layer substrate 40 is mainly made up of a plurality of ceramic layers 41 in which multi-layers are integrated by being sintered and of a conductor pattern 44. The conductor pattern 44 includes an electrode on which a semiconductor device 31 formed on a bottom of a cavity 46 provided on a main surface on a surface side of the multi layer substrate 40 is mounted, a terminal electrode and ground pattern formed on the main surface on a rear side of the cavity, a plurality of thermal vias to connect the ground pattern with the electrode, an internal conductor pattern making up a capacitor element and inductor element, line paths connecting these components, via holes, and the like. The electrode (pad) 42 being connected to the conductor pattern 44 is formed on a main surface on a surface side of the multi layer substrate 40. The semiconductor element 31 is housed in the cavity 46 formed on the multi layer substrate 40 and is electrically connected by the electrode 42 and bonding wire 43 formed in a portion surrounding the cavity 46.

The electrode 42, as shown in the enlarged diagram in FIG. 9, is made up of a base electrode 420 made of, for example, Ag, and of a coating layer 421 to coat the surface of the base electrode 420. The coating layer 421 includes the Ni layer 421a to coat the base electrode 420, the Pd layer 421b to coat the Ni layer, and the Au layer 421c to coat the Pd layer. By performing wire bonding on the electrode structure, it was possible to obtain the high frequency electrode component having high reliability and highly stable bonding strength.

Patent Reference 1: Japanese Patent Application Laid-open No. 2005-72282.

DISCLOSURE OF THE INVENTION

Problems to be Solved by the Invention

However, in the technology described in Patent reference 1, the bonding strength of the bonding after the thermal treatment in particular was not sufficient. The reason for this is thought to be not only Ni diffused on the Au surface but also Pd diffused on the Au surface. Moreover, in the Patent Reference 1, only the case where the aluminum bonding was used, however, in some cases, the electrode structure is bonded by using soldering. In this case, the temperature at the time of bonding becomes 300° C. or higher and, therefore, due to the same reason as above, the bonding strength was not sufficient.

Therefore, it was difficult to obtain a semiconductor module having a sufficient bonding strength in the electrical connection portion and high reliability.

The present invention has been made in light of the problems described above and has an object to provide an invention that can solve the above problems.

Means for Solving Problems

In order to solve the above problems, the present invention has the following configurations.

An electrode structure of the present invention is characterized by including a coating layer having a nickel (Ni) layer, a palladium (Pd) layer with phosphorous (P) being added to, and a gold (Au) layer sequentially stacked on a metal circuit plate, wherein an average P concentration in the Pd layer is in a range of more than 2.6% by mass and not more than 6.0% by mass and wherein the P concentration on a side being in touch with the Au layer in the Pd layer is higher by 1% by mass than that on a side being in touch with the Ni layer in the Pd layer.

The electrode structure of the present invention is characterized in that the Pd layer has an amorphous structure.

The electrode structure of the present invention is characterized in that P has been added to the Ni layer.

The electrode structure of the present invention is characterized in that the metal circuit plate is made of copper or a copper alloy.

The electrode structure of the present invention is characterized in that a thickness of the Pd layer is in a range between 0.05 μm to 0.2 μm.

The electrode structure of the present invention is characterized in that a thickness of the Au layer is in a range between 0.05 μm to 0.2 μm.

A method for manufacturing an electrode structure for sequentially stacking a nickel (Ni) layer, a palladium (Pd) layer with phosphorus being added, and a gold (Au) layer on a metal circuit plate is characterized by including an Ni layer forming process for forming the Ni layer, by plating, on the metal circuit plate, a Pd layer forming process for forming the Pd layer, by plating, on the Ni layer, an Au layer forming process for forming the Au layer, by plating, on the Ni layer, and an AU layer forming process for the Au layer, by substitution-type plating on the Pd layer.

The method for manufacturing the electrode structure is characterized by performing the substitution-type plating at plating liquid temperatures of 50° C. to 80° C. in the pH range of 4.0 to 9.0.

The method for manufacturing the electrode structure is characterized in that an additional Au forming process is performed by reduction-type plating after the Au layer forming process.

A circuit board of the present invention is characterized in that the electrode structure is formed on a ceramic substrate.

A semiconductor module of the present invention is characterized in that a semiconductor chip is mounted on a circuit board and the semiconductor chip is electrically connected to the electrode structure.

The semiconductor module of the present invention is characterized in that the electrical connection is achieved by a bonding wire.

The semiconductor module of the present invention is characterized in that the material for the bonding wire contains aluminum or gold as its main ingredient.

The semiconductor module of the present invention is characterized in that the bonding wire is connected to the electrode structure by ultrasonic bonding.

An electrode structure of the present invention is characterized by including a coating layer having a nickel (Ni) layer, a palladium (Pd) layer with phosphorous (P) being added to, and a gold (Au) layer sequentially stacked on a base electrode, wherein an average P concentration in the Pd layer is in a range of more than 2.6% by mass and not more than 6.0% by mass and wherein the P concentration on a side being in touch with the Au layer in the Pd layer is higher by 1% by mass than that on a side being in touch with the Ni layer in the Pd layer.

The electrode structure of the present invention is characterized in that the Pd layer has an amorphous structure.

The electrode structure of the present invention is characterized in that P has been added to the Ni layer.

The electrode structure of the present invention is characterized in that the metal circuit is made of copper or a copper alloy.

The electrode structure of the present invention is characterized in that a thickness of the Pd layer is in a range between 0.05 μm to 0.2 μm.

The electrode structure of the present invention is characterized in that a thickness of the Au layer is in a range between 0.05 μm to 0.2 μm.

A method for manufacturing an electrode structure of the present invention for sequentially stacking a nickel (Ni) layer, a palladium (Pd) layer with phosphorus being added, and a gold (Au) layer on a metal circuit plate is characterized by including an Ni layer forming process for forming the Ni layer, by plating, on the metal circuit plate, a Pd layer forming process for forming the Pd layer, by plating, on the Ni layer, an Au layer forming process for forming the Au layer, by plating, on the Ni layer, and an AU layer forming process for the Au layer, by substitution-type plating on the Pd layer.

The method for manufacturing the electrode structure of the present invention is characterized by performing the substitution-type plating at plating liquid temperatures of 50° C. to 80° C. in the pH range of 4.0 to 9.0.

The method for manufacturing the electrode structure of the present invention is characterized in that an additional Au forming process is performed by reduction-type plating after the Au layer forming process.

A layer stacked substrate of the present invention is characterized by including a ceramic layer and an electrode connecting to an internal conductor pattern formed in the ceramic layer so as to be exposed toward an outside, wherein the electrode is made up of the electrode structures described above.

A high frequency electronic component of the present invention is characterized in that a semiconductor chip is mounted on the layer stacked substrate described above and wherein electrical connection is established between the semiconductor chip and the electrode structure.

The high frequency electronic component of the present invention is characterized in that the electrical connection is established by a bonding wire.

The semiconductor module of the present invention is characterized in that the material for the bonding wire contains aluminum or gold as its main ingredient.

The semiconductor module of the present invention is characterized in that the bonding wire is connected to the electrode structure by ultrasonic bonding.

Effects of the Invention

Since the present invention is configured as above, it is possible to obtain the semiconductor module which has satisfactory bonding strength and high reliability in the electrical bonded portion even after the thermal process.

BEST MODE CARRYING OUT THE INVENTION

Hereinafter, a concrete embodiment of the present invention is described. However, the present invention is not limited to the embodiment described herein.

FIG. 1 is a cross-sectional view of a semiconductor module using an electrode structure of an embodiment of the present invention. In a circuit board 20, a metal circuit plate 22 is formed on a ceramic substrate 21 having an insulating property and a semiconductor chip 11 is mounted thereon. The semiconductor chip 11 is connected to the metal circuit plate 22 by an Au (gold) bonding wire 23. In the connecting portion between the metal circuit plate 22 and the bonding wire 23 is formed a coating layer 24 used to achieve good adhesion therebetween. The coating layer 24, as shown in an enlarged diagram of FIG. 1, is made up of a Ni (nickel) layer 241, P (phosphorous) containing Pd (palladium) layer 242, and Au layer 243, stacked in order from a lower side.

The ceramic substrate 21 is an insulating material having a high thermal conductivity and, for example, a silicon nitride ceramic with a thickness of about 0.32 mm. The metal circuit plate 22, in order to serve as a wiring on the circuit board 20, is made of Cu (copper), Al (aluminum), or an alloy thereof as a material having both a high thermal conductivity and a low electric resistivity, which forms a predetermined pattern to serve as a wiring. The thickness of the metal circuit plate 22 is suitably selected in a range between 0.1 mm to 3.0 mm so as to have an efficient radiation characteristic after consideration of the pattern, size, and thickness when it is used in the semiconductor module 10. Moreover, for the connection between the metal circuit plate 22 and ceramic substrate plate 21, brazing providing high bonding strength is used. As the brazing material, for example, a Ag(silver)-Cu—Ti based active metal brazing material can be employed which enables the bonding therebetween at 700° C. or higher. Moreover, the patterning of the metal circuit plate 22 may be performed before the brazing thereon, or, after the bonding of the plane cupper plate or the like on an entire surface of the ceramic substrate 21 and by using the wet etching method or the like.

The semiconductor chip 11 is a power semiconductor device such as an IGBT made of, for example, silicon or the like. The mechanical connection between the semiconductor chip 11 and circuit board 20 is performed by using a soldering method which enables the bonding at a lower temperature compared with the brazing method. Therefore, electrical connection between the semiconductor chip 11 and metal circuit plate 22 can be performed by the soldering method, however, in addition to this, the electrical connection is also performed by the bonding wire 23.

The coating layer 24 is formed on the metal circuit plate 22 connecting to the bonding wire 23. That is, the electrode used in the circuit board 20 is made up of a laminated structure consisting of a metal circuit plate 22 and coating layer 24 formed on the metal circuit plate 22, and electrical connection is taken out from the coating layer 24.

The Ni layer 241 making up the coating layer 24 is formed, for example, by plating, on the metal circuit plate 22. The thickness of the Ni layer 241 is about 8 μm and, since the Ni layer 241 is used as a barrier layer to prevent the contact between the metal circuit plate 22 and a plated portion, its thickness is preferably in the range of 6 μm to 10 μm in particular. Moreover, P may be added to the Ni layer 241. Particularly, the Ni layer 241 depresses the oxidation of Cu making up the metal circuit plate 22 and relieves mechanical stress arising between the bonding wire 23 and metal circuit plate 22 at the time of wire bonding. By adding P to the Ni layer 241, an amount of solder erosion of the Ni layer 241 can be reduced.

The P-distributed Pd layer 242 is formed, for example, by plating on the Ni layer 241. P (phosphorous) is doped to the P-distributed Pd layer 242 and the P concentration is higher on the side of the Au layer 243 side than that on the Ni layer 242 side. The average P concentration in the P-distributed Pd layer 242 is about 4% by mass and is preferably in the range of more than 2.6% by mass and not more than 6.0% by mass in order to prevent the diffusion of Ni into the Au film. It is also preferable that the P concentration on the side of the Au layer 243 is higher, by 1% or more by mass, than that on the side of the Ni layer 241 to fully satisfy the bonding strength described later. As is described later, the P-distributed Pd layer 242 functions as a barrier layer to suppress the diffusion of various elements. At this time, if the P-distributed Pd layer 242 has a polycrystalline structure, the influence by the diffusion in grain boundary becomes larger which causes the difficulty in ensuring a full barrier property and, therefore, the P-distributed Pd layer preferably has an amorphous structure. Moreover, described above, an average P concentration in the P-distributed Pd layer 242 and the difference in the P concentration exert influences on the prevention of the Pd diffusion and, in order to ensure the effect caused by the concentration, the thickness of the P-distributed Pd layer 242 is, for example, about 0.1 μm and is preferably within a range between 0.05 to 0.2 μm which leads to excellent Au wire bonding.

The Au layer 243 is formed on the P-distributed Pd layer 242, for example, by a displacement plating method. Its thickness is, for example, about 0.1 μm. In FIG. 1, the Au layer 243 is formed on a top surface of the coating layer 24 and, therefore, the electrical connection produced by the bonding is taken through the Au layer 243. Moreover, when the Au layer 243 is formed by reduction plating, the thickness of the Au layer 243 that can be obtained is only 0.2 μm and, therefore, when the Au layer 243 having larger thickness is formed, by performing the reduction plating after the displacement plating, desired thickness can be obtained. The thickness of the Au layer is preferably within a range between 0.05 μm to 0.2 μm to achieve excellent wire bonding.

Moreover, the thickness of the coating layer 24 is set appropriately depending on the thickness of the bonding wire 23. Its patterning is achieved, when the three layers are formed by a plating process, by selectively plating these layers, or by performing a wet etching process after forming the coating layer 24 entirely on the metal circuit plate 22.

In order to enhance bonding strength of this structure, high bonding strength at all interfaces is required. Here, both Ni and Cu are diffused at a bonding interface and the bonding strength is excellent because an alloy is formed. Therefore, the bonding strength between the Ni layer 241 and metal circuit plate 22 becomes high. Also, the bonding strength between Pd and Ni is excellent in a same manner and, therefore, the bonding strength between the P-distributed Pd layer 242 and Ni layer 241 in the coating layer 24 is also excellent.

Since the bonding strength between Pd and Au is excellent, the bonding strength between the Au layer and P-distributed Pd layer is also excellent.

Here, since Al and Au are diffused from each other at the bonding interface, the bonding strength between Al and Au is generally excellent, however, if other elements exist at this interface, the adhesion is affected by the existence of other elements. In this structure, an element exerting influence on the bonding wire 23 made of Al and Au layers 243 include the element diffused on the surface of the Au layer 243 (surface on the side being in contact with the bonding wire 23). In this embodiment, Al is used as a material for the bonding wire 23, however, even if Au is used as the material for the bonding wire 23, the same occurs. Particularly, the diffusion occurs when thermal processing such as soldering at temperatures of 300° C. or higher.

As described in Patent Reference 1. as the element described above, Cu making up the metal circuit plate 22 and Ni making up the Ni layer 241 are available. In order to suppress the diffusion, the P-distributed Pd layer 242 having Pd as a main component is used. Particularly, by doping P, the effect of suppression of the diffusion of Ni from the Ni layer 241 is enhanced.

However, Pd also diffuses on the surface of the Au layer 243, as in the case of Ni and Cu, which exerts adverse effects on the junction between the bonding wire 23 and Au layer 243. In the structure (FIG. 8) described in the Patent Reference 1, the above influence is inevitable and, therefore, it has been difficult to obtain satisfactory bonding length in the wiring bonding. In order to suppress the diffusion of Pd, to raise the concentration of P doped to the Pd layer is effective, however, as described in paragraph 0040 of the Patent Reference 1, peeling between the Pd layer and Ni layer is liable to occur.

In the electrode structure used in the circuit board 20 of the embodiment of the present invention, the P concentration in the P-distributed Pd layer 242 is not made uniform but made low on the Ni layer 241 side and is made high on the Au layer 243 side. This enables the diffusion of the Pd toward the Au layer 243 to be suppressed and peeling between the P-distributed Pd layer 242 and Ni layer 241 to be also suppressed. Therefore, high bonding strength can be stably given even after the thermal processing.

The method of manufacturing the electrode used in the above semiconductor module (circuit board) is described below. FIG. 2 is a process diagram showing the manufacturing method.

First, the Ni layer 241 is formed on the metal circuit plate 22 by an electroless plating process (S1: Ni layer forming process). The electroless plating in this case is performed, for example, by using a phosphorus-based reducing agent such as sodium hypophosphite, and the adjustment of the concentration of P in the plating solution enables the doped amount of P in the Ni layer 241 to be adjusted. Moreover, the P concentration can be adjusted by setting the pH of the plating solution, stabilizer, and additive. The thickness of the Ni layer 241 can be adjusted by the time during which the plating is performed.

Similarly, the P-distributed Pd layer 242 is formed, by electroless plating using a reducing agent such as sodium hypophosphite on the Ni layer 241 (S2: Pd layer forming process). The P concentration in this case can be adjusted as in the case of the Ni layer 241. Also, the thickness of the P-distributed Pd layer 242 can be adjusted by the plating time. However, unless the plating condition is not changed during the plating time, the P concentration in the P-distributed Pd layer 242 becomes almost uniform. That is, the P concentration distribution can be changed so as to have a state being different from its previous one.

Next, on the P-distributed Pd layer 242 formed by the above method is formed the Au layer by using the displacement plating (S3: Au layer forming process). Since Pd has a higher ionization tendency than Au, the substitution-type plating can be applied. The displacement plating is performed at temperatures of 50° C. to 80° C. in the pH range of 4.0 to 9.0 by using, for example, Pallet II produced by KOJIMA CHEMICALS Co., Ltd. In this case, substitution reaction occurs on the surface of the P-distributed Pd layer. That is, the Au layer 243 is formed by the substitution reaction in which Pd is eluted and Au is deposited and the elution of Pd is stopped when the surface of the P-distributed Pd layer is entirely covered by Au, the substitution reaction stops and the thin Au layer 242 is automatically obtained. At the time of substitution reaction, P is not eluted and P is accumulated in proximity to an interface between the formed Au layer 243 and P-distributed Pd layer 242. As a result, the P concentration in the Pd layer 242 becomes high on the Au layer side. That is, the P concentration described as above can be obtained.

Moreover, in the displacement plating, as described above, only the layer that can be obtained is a thin Au layer 243 and, as in the case of the Ni layer 241, thereafter, by additionally performing a reduction electroless plating (S4: additional Au layer forming process), with the P concentration distribution in the P-distributed Pd layer 242 being still maintained, the Au layer 243 can be formed so as to have a desired thickness.

FIG. 3 shows a photo showing a cross section of the electrode actually manufactured by the manufacturing method descried above and observed by an electron microscope after the manufacturing of the electrode and before the heat treatment. In the lower side of FIG. 3, a table showing the result from the measurement, by using EDX (Energy dispersive X-ray fluorescence spectrometry) of compositions of P, Ni, Pd, and Au in the regions 1 to 7 surrounded by broken lines in FIG. 3 is shown. In the left lower side of the photo in FIG. 3, a state of electron diffraction in the portion shown by the X mark in the cross section is shown.

It is confirmed from the result that the P concentration is higher on the upper side and lower on the lower side in regions 4 to 6 in the P-distributed Pd layer 242. It can be also confirmed that the P-distributed Pd layer 242 is an amorphous layer.

For comparison, an electrode in which Pd layer without P doping is formed between the Ni layer and Au layer. In each of the manufacturing methods, the same conditions were applied thereto except that P is not doped to the Pd layer. FIG. 4 shows the result from observation and measurement of the electrode as in the case of FIG. 3.

The result shown in FIG. 4 shows that, even when P is doped to a Ni layer on which the Pd layer is formed, P does not diffuse into the Pd layer. Moreover, because P does not exist in the layer, the Pd layer is not an amorphous layer but a polycrystalline layer.

In either electrode shown in FIGS. 3 and 4, on a top surface (region 1) of the Au layer, the existence of a slight amount of Ni and Pd is confirmed. The existence of the amount of Ni and Pd is caused by the diffusion from the Ni and Pd layers at the time of the plating process.

Next, in the electrode structure in FIGS. 3 and 4, the concentration profile of Au, Pd, and P obtained after the heat treatment at 360° C. for one minute are investigated by GD-OES (Glow Discharge Optical Emission Spectrometry). The results are shown in FIG. 5. In this measurement, the concentration from the surface (on the Au layer 24) of the coating layer 24 along the depth direction is measured. FIG. 5(a) shows the result of the electrode in FIG. 3 (P-distributed Pd layer is used) and FIG. 5 (b) shows the result of the electrode (Pd layer without P doping). It was confirmed from the result that the amount of Pd diffused on a surface of the Au layer after thermal treatment in the structure in FIG. 3 is reduced greatly than that of Pd diffused in the structure of FIG. 4. As described above, this effect is realized by the influence of high P concentration region in the P-distributed Pd layer 242.

In the distribution of Au in FIG. 5, the layer in which Au is accumulated in proximity with the interface between the P-distributed Pd layer and Ni layer 241 can be observed. This layer corresponds to Au deposited in proximity with the interface via a pinhole of the P-distributed Pd layer 242 at the time of displacement plating of Au. This amount is larger than the electrode shown in FIG. 3(a).

Next, the concentration profile of Ni is shown in FIG. 6 in the same manner as above. It was also confirmed that the diffusion of Ni was greatly suppressed in the electrode of FIG. 3. Here, as described above, though the influence by a pin hole in the P-distributed Pd layer in the electrode in FIG. 3 was observed, the amount of Ni on the surface of the Au layer 243 was reduced. This is due to the blockage of the pinhole by Au.

In some cases, the compositions of elements each having a different absolute value in FIGS. 3 to 6, which are supposed to occur due to an error caused by a measuring sample and measuring method. Therefore, no problems arise in the comparison in tables of FIGS. 3 and 4 and FIGS. 5(a) and 5(b) and FIG. 6 where same measurement is performed on samples having a same shape and, though there is an error in the absolute value of Pd or Ni compositions, it is considered that the size relationship among them is correctly measured.

Therefore, it is confirmed, in the electrode in FIG. 3, that the diffusion of Pd and Ni into the Au layer 243 is greatly suppressed. This enables the bonding strength between the metal circuit plate 22 and the bonding wire 23 to be higher and a highly reliable circuit board to be obtained.

In the above embodiment, the case where Al is used as a material for the bonding wire is employed is explained, however, even in the case where the bonding wire having Al as its main component, or the bonding wire made of Au or having Au as its main component is used, the similar effect can be obtained.

In the above embodiment, the case where the bonding wire is used is described. However, even if the bonding is performed by soldering, it is apparent that Ni or Pd existing on the surface of the Au layer exerts adverse influence on the bonding. Therefore, it is also apparent that, even when the bonding is performed by soldering, the electrode structure of the present invention is effective in the same manner.

Therefore, in the circuit board or semiconductor module using the electrode structure, the bonding strength is higher and reliability becomes higher.

Moreover, in the above embodiment, by using the displacement plating when the Au layer is formed, the P distribution described above is realized, however, the present invention is not limited to this. For example, in the Pd layer forming process, by setting plating conditions not to be uniform and by changing the plating condition in the way, it is possible to raise the P concentration on the Au layer side. In this case, in the Au layer forming process, instead of the displacement plating, the reduction plating may be used and, further, a thin Au layer can be obtained by single plating process without using the additional Au layer forming process.

EXAMPLE

Examples and comparative examples are explained hereinafter. A simple comparison of bonding strength of the bonding is made.

The material for the bonding wire used here is Au and has a diameter of 27 μmϕ. The metal circuit plate being 20 μm in thickness and is made of Ag and, on the metal circuit plate serving as a substrate layer of the electrode structure are sequentially formed the Nickel layer, Pd layer, and Au layer by using plating and wire bonding is performed on the Au layer. The condition for ultrasonic bonding is 900 W. Moreover, the bonding between the ceramic substrate mounted below the metal circuit plate and metal circuit plate is performed at 320° C. by using Sn—Sb as a brazing material.

Here, after thermal treatment at 360° C. in an air for 1 min, by pulling the connected bonding wire, the bonded structure was broken. FIG. 7 is a schematic diagram of the bonded portion between the bonding wire and electrode structure shown from an upper side shown in FIG. 1 and a swollen portion on the right side is the bonded portion between the bonding wire and electrode structure (Au layer) by the ultrasonic bonding method. A research was made as to where and in which part of the bonding wire in the structure has broken. In the case of breakage in the region W as shown in FIG. 7, it is shown that the bonding wire itself is broken due to sufficient bonding strength in the bonded portion between the Ni layer and metal circuit plate. If the breakage has occurred in the region "c", the breakage may have occurred in any one of the bonded portions between the bonding wire and Au layer, bonded portion between layers in the coating layer, and in the bonded portion between the Ni layer and metal circuit plate. Therefore, in this case, the breakage had occurred in any one of the interfaces before the breakage of the bonding wire itself, thus showing that the bonding strength in the structure was insufficient. In the case of the breakage in the region "a" or region "b", the breakage is interpreted in accordance with the cases of breakages in the region W and the region "c". That is, it is judged that, when the breakage occurs in the region W, the highest bonding strength is achieved and the bonding strength becomes higher sequentially in order of the region "a", region "b", and region "c".

Samples for examples 1 to 7, comparative examples 1 to 3, comparative examples 4 to 6, and examples 7 to 11 are prepared to perform the rupture test. The details of these electrode configurations and results from the rupture tests are shown in tables in which the examples 1 to 7 are shown in Table 1, the comparative examples 1 to 3 are in Table 2, and comparative examples 4 to 6 are in Tables 7 to 11.

Here, in the examples 1 to 7, the thickness of the Pd layer is set to be in the range between 0.05 μm to 0.20 μm and the average P concentration is set to be in the range of more than 2.6% by mass and not more than 6.0% by mass and the difference between the P concentration on the Au layer side and the P concentration on the Ni layer side is 1% by mass or more. Moreover, the Au layer is formed by the electroless displacement plating method (using NC gold Pd as the plating solution at 60° C. and pH 7.3) and an additional Au layer forming process is not performed. The thickness of the Au layer is in the range between 0.05 μm to 0.20 μm.

In the comparative examples 1 to 3, the thickness of the Pd layer is the same as in the examples 1 to 7, however, P is not doped. In the comparative examples 4 to 6, the Au layer is formed by the electroless reduction plating (using Supermex #850 as plating solution at 70° C. and pH 7.0) without the use of the displacement plating method and the difference between the P concentration on the Au layer side and P concentration on the Ni layer side is set to be less than 1% by mass. In the comparative examples 7 to 11, the average P concentration in the Pd layer is set to be less than 2.9% by mass.

In the rupture test, 30 pieces of the bonding wires of each of the above samples are pulled to find out the ruptured regions and the ratio of the regions where the rupture occurs in FIG. 7 was checked.

TABLE 1

| | Ni layer thickness (μm) | Pd layer P concentration (% by mass) | | | | Au side – Ni side | Crystallinity | Thickness (μm) |
|---|---|---|---|---|---|---|---|---|
| | | Ni side | Central Region | Au side | Average | | | |
| Example 1 | 8 | 2.3 | 2.6 | 3.9 | 2.00 | 1.6 | Amorphous | 0.1 |
| Example 2 | 10 | 4.2 | 4.2 | 5.7 | 4.70 | 1.5 | Amorphous | 0.2 |
| Example 3 | 3 | 5.2 | 5.4 | 6.9 | 5.83 | 1.7 | Amorphous | 0.2 |
| Example 4 | 3 | 3.8 | 4.0 | 6.0 | 4.60 | 2.2 | Amorphous | 0.05 |
| Example 5 | 8 | 4.7 | 5.1 | 7.2 | 5.67 | 2.5 | Amorphous | 0.1 |
| Example 6 | 8 | 3.5 | 3.8 | 6.0 | 4.10 | 1.5 | Amorphous | 0.1 |
| Example 7 | 10 | 4.4 | 4.4 | 6.1 | 4.87 | 1.7 | Amorphous | 0.05 |

| | Au layer | | | Ratio of ruptured region (%) | | | |
|---|---|---|---|---|---|---|---|
| | Pd layer side (displacement) | Additional layer (reduction) | Total Thickness (μm) | W | a | b | c |
| Example 1 | 0.1 | Non | 0.1 | 100 | 0 | 0 | 0 |
| Example 2 | 0.2 | Non | 0.2 | 100 | 0 | 0 | 0 |
| Example 3 | 0.05 | Non | 0.05 | 100 | 0 | 0 | 0 |
| Example 4 | 0.05 | Non | 0.05 | 100 | 0 | 0 | 0 |
| Example 5 | 0.1 | Non | 0.1 | 100 | 0 | 0 | 0 |
| Example 6 | 0.1 | Non | 0.1 | 100 | 0 | 0 | 0 |
| Example 7 | 0.2 | Non | 0.2 | 100 | 0 | 0 | 0 |

TABLE 2

| | Ni layer thickness (μm) | Pd layer P concentration (% by mass) | | | | Au side – Ni side | Crystallinity | Thickness (μm) |
|---|---|---|---|---|---|---|---|---|
| | | Ni side | Central Region | Au side | Average | | | |
| Comparative Example 1 | 3 | 0 | 0 | 0 | 0.00 | 0.0 | Crystal | 0.05 |
| Comparative Example 2 | 8 | 0 | 0 | 0 | 0.00 | 0.0 | Crystal | 0.1 |
| Comparative Example 3 | 10 | 0 | 0 | 0 | 0.00 | 0.0 | Crystal | 0.2 |

| | Au layer | | | Ratio of ruptured region (%) | | | |
|---|---|---|---|---|---|---|---|
| | Pd layer side (displacement) | Additional layer (reduction) | Total Thickness (μm) | W | a | b | c |
| Comparative Example 1 | 0.05 | Non | 0.05 | 70 | 30 | 0 | 0 |
| Comparative Example 2 | 0.1 | Non | 0.1 | 73 | 27 | 0 | 0 |
| Comparative Example 3 | 0.2 | Non | 0.2 | 70 | 30 | 0 | 0 |

TABLE 3

| | Ni layer thickness (μm) | Pd layer | | | | | | |
|---|---|---|---|---|---|---|---|---|
| | | P concentration (% by mass) | | | | | Crystallinity | Thickness (μm) |
| | | Ni side | Central Region | Au side | Average | Au side – Ni side | | |
| Comparative Example 4 | 3 | 35 | 3.3 | 4.0 | 3.77 | 0.5 | Amorphous | 0.05 |
| Comparative Example 5 | 8 | 2.5 | 2.6 | 2.9 | 2.67 | 0.1 | Amorphous | 0.1 |
| Comparative Example 6 | 10 | 3.9 | 4.1 | 4.5 | 4.17 | 0.6 | Amorphous | 0.2 |

| | Au layer | | | Ratio of ruptured region (%) | | | |
|---|---|---|---|---|---|---|---|
| | Pd layer side (displacement) | Additional layer (reduction) | Total Thickness (μm) | W | a | b | c |
| Comparative Example 4 | Non | 0.3 | 0.3 | 63 | 37 | 0 | 0 |
| Comparative Example 5 | Non | 0.4 | 0.4 | 59 | 31 | 0 | 0 |
| Comparative Example 6 | Non | 0.5 | 0.5 | 71 | 29 | 0 | 0 |

TABLE 4

| | Ni layer thickness (μm) | Pd layer | | | | | | |
|---|---|---|---|---|---|---|---|---|
| | | P concentration (% by mass) | | | | | Crystallinity | Thickness (μm) |
| | | Ni side | Central Region | Au side | Average | Au side – Ni side | | |
| Comparative Example 7 | 3 | 1 | 1.1 | 2.3 | 1.47 | 1.3 | Crystal | 0.05 |
| Comparative Example 8 | 8 | 1.1 | 1.3 | 2.4 | 1.60 | 1.3 | Crystal | 0.1 |
| Comparative Example 9 | 10 | 1.7 | 1.8 | 3.3 | 2.30 | 1.6 | Crystal | 0.05 |
| Comparative Example 10 | 10 | 1.1 | 1.3 | 2.7 | 1.70 | 1.6 | Crystal | 0.2 |
| Comparative Example 11 | 3 | 2.0 | 2.2 | 3.8 | 2.60 | 1.6 | Crystal | 0.2 |

| | Au layer | | | Ratio of ruptured region (%) | | | |
|---|---|---|---|---|---|---|---|
| | Pd layer side (displacement) | Additional layer (reduction) | Total Thickness (μm) | W | a | b | c |
| Comparative Example 7 | 0.05 | Non | 0.05 | 72 | 28 | 0 | 0 |
| Comparative Example 8 | 0.1 | Non | 0.1 | 77 | 23 | 0 | 0 |
| Comparative Example 9 | 0.2 | Non | 0.2 | 85 | 15 | 0 | 0 |
| Comparative Example 10 | 0.2 | Non | 0.2 | 79 | 21 | 0 | 0 |
| Comparative Example 11 | 0.05 | Non | 0.09 | 90 | 10 | 0 | 0 |

The above results show that, in the examples 1 to 7 of the embodiment of the present invention, since P has a specified concentration and distribution in the Pd layer, the Pd layer functions as a barrier layer to suppress the diffusion of various elements such as Pd and Ni into the Au layer and the region W was 100%. In the comparative examples 1 to 11, the region W was not 100%, however, it was confirmed that the examples could provide the excellent bonding strength.

Moreover, in the above example, the case where the electrode of the present invention is formed on the metal circuit plate is shown and the circuit board having the metal circuit plate and semiconductor module are described. However, it is apparent that the present invention is not limited to the above examples and the electrode of the present invention can be applied to the electrode in the multi layer substrate using a ceramic. In this case, the electrode structure of the present invention can be applied in the multi layer substrate in which ceramic layers are stacked and an electrode connecting to an internal conductor pattern is exposed toward the outside. For example, by forming the base electrode having the structure shown in FIG. 9, instead of the metal circuit plate, on a multi layer substrate, a high frequency electronic component can be produced. By configuring above, reliability of the high frequency electronic component can be enhanced as in the case of the above semiconductor module.

Figure 1:
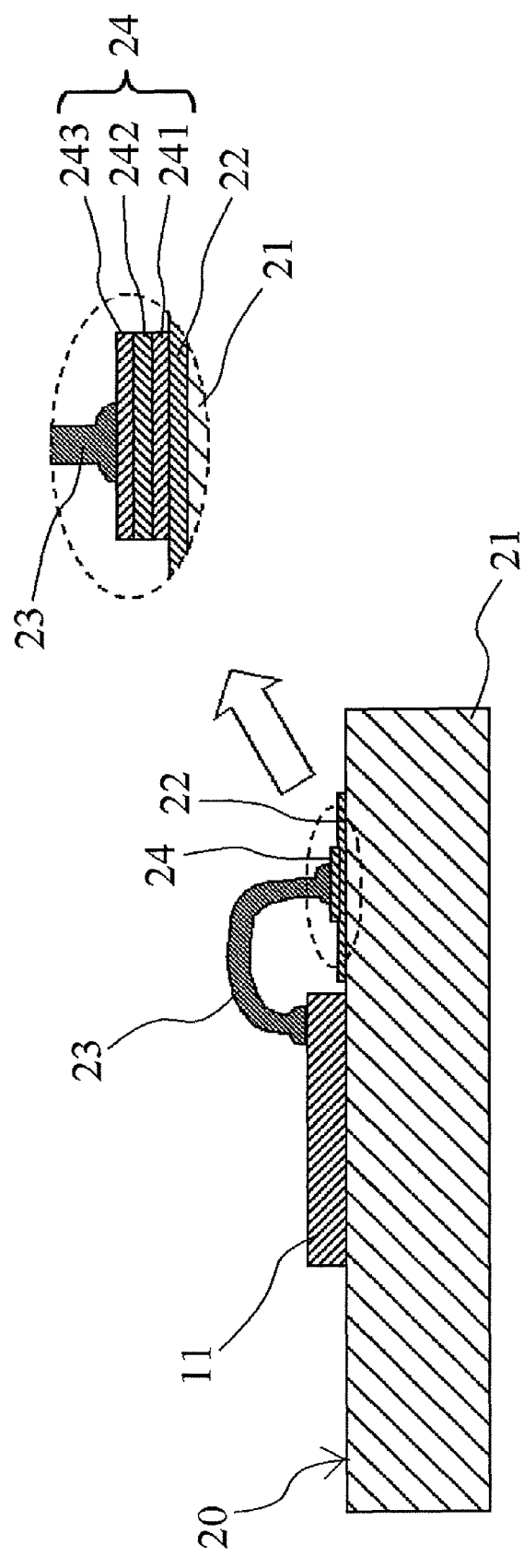
FIG. 1 is a cross-sectional view of a semiconductor module of the embodiment of the present invention.
Figure 2:
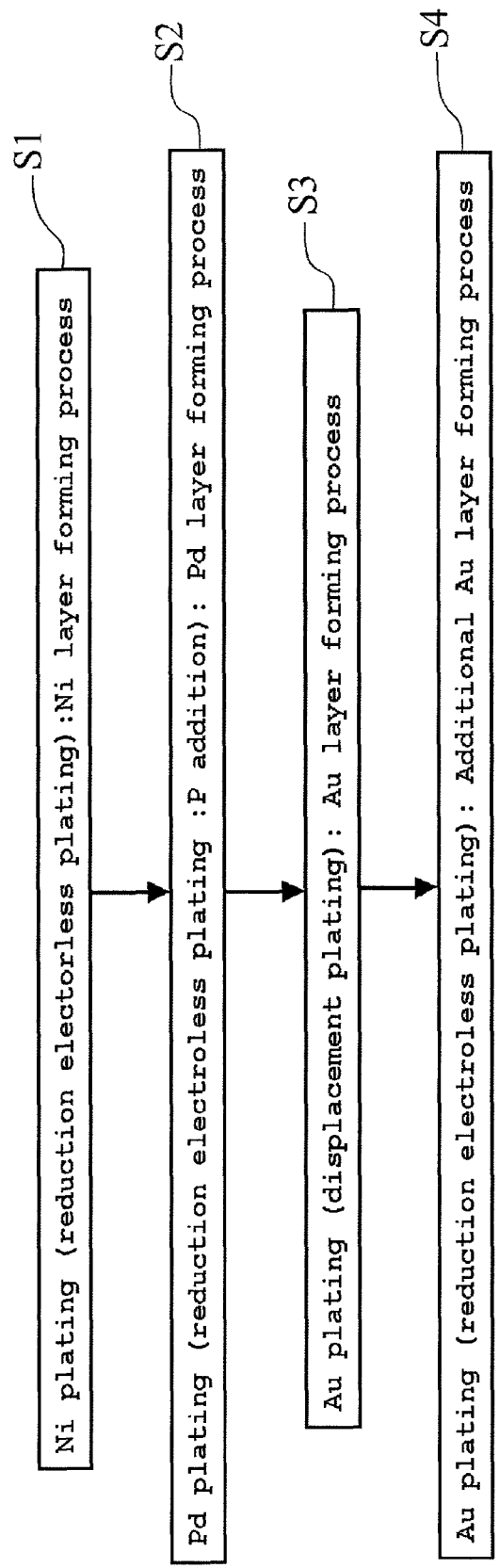
FIG. 2 is a flow chart showing a manufacturing method of an electrode structure of the embodiment of the present invention.
Figure 3:
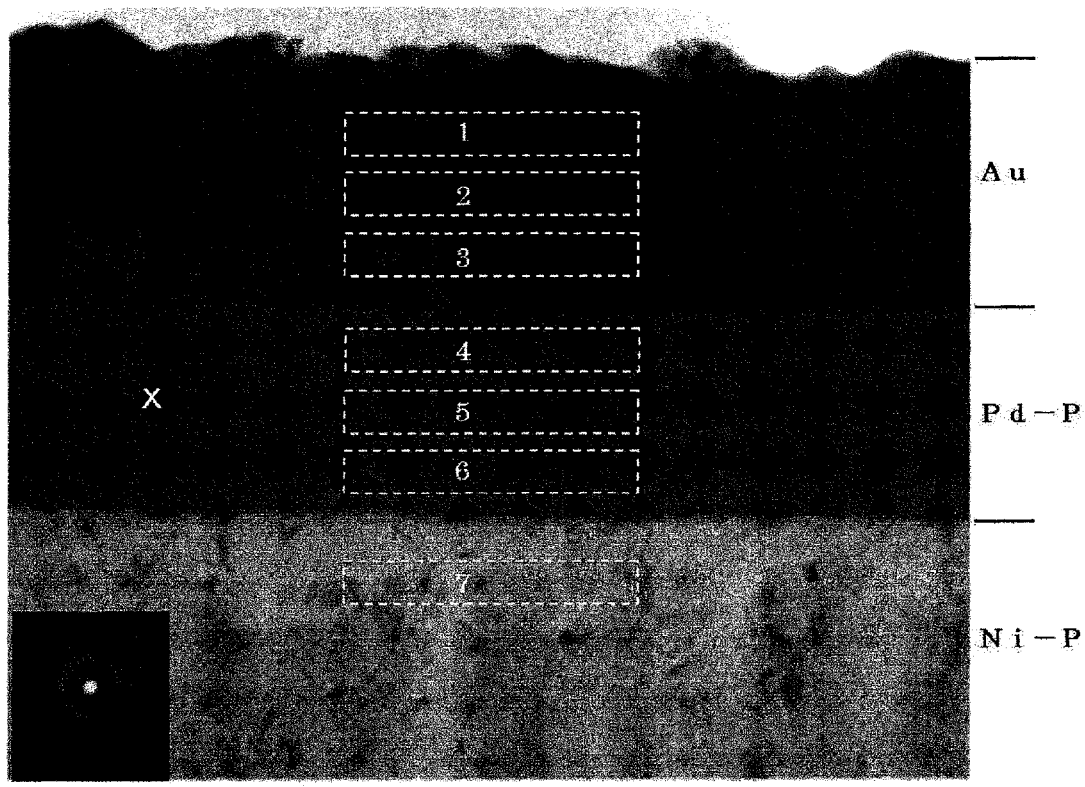
FIG. 3 is a photo showing the cross section of the electrode structure of the embodiment of the present invention taken by using an electron microscope and a table showing electron diffraction pattern and composition analysis.
Figure 4:
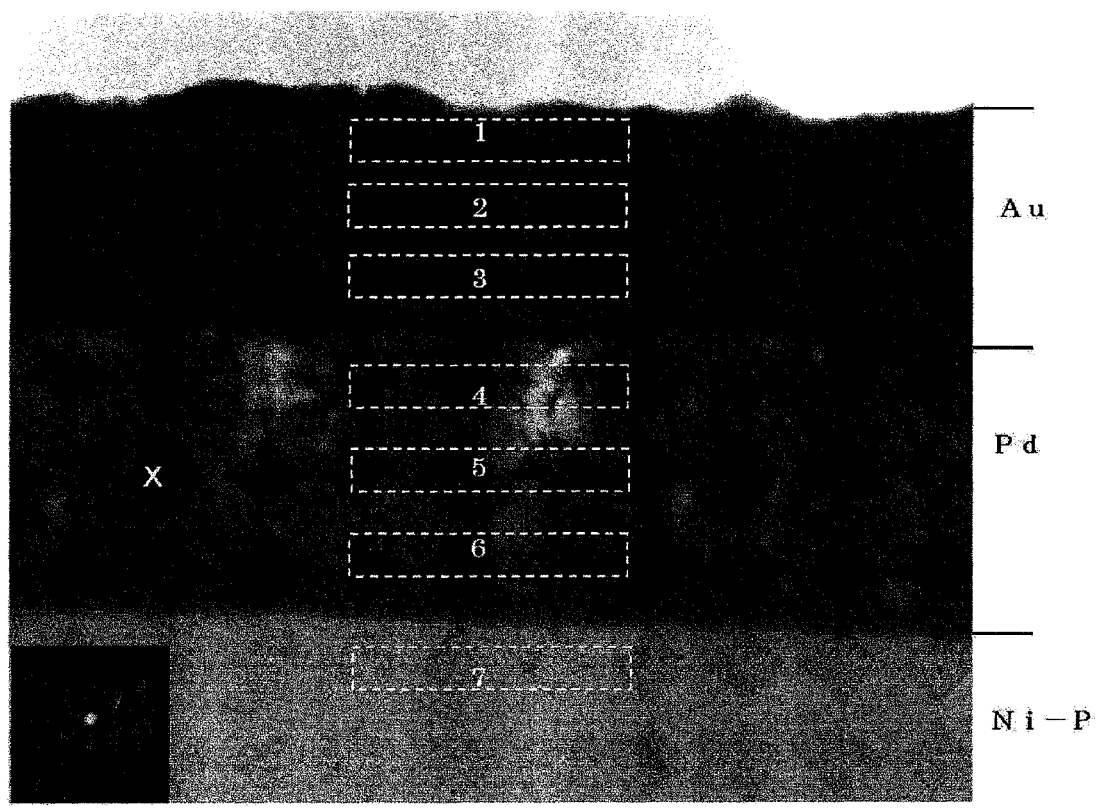
FIG. 4 is a photo showing the cross section of the conventional electrode structure of the embodiment of the present invention taken by using an electron microscope and a table showing an electron diffraction pattern and composition analysis result.
Figure 5:
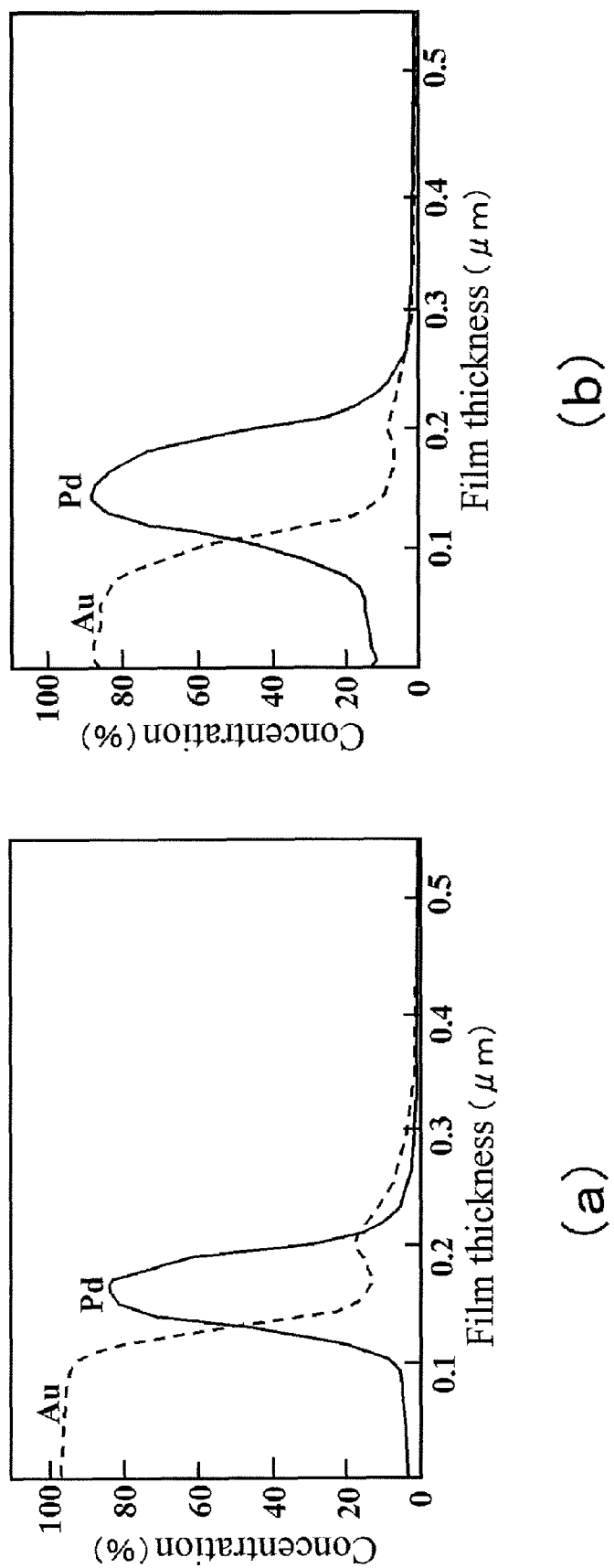
FIG. 5 shows the result from the GD-OES of the concentration profile of Au and Pd in the electrode structure after heat treatment in the case of the present embodiment (a) and the conventional example (b).
Figure 6:
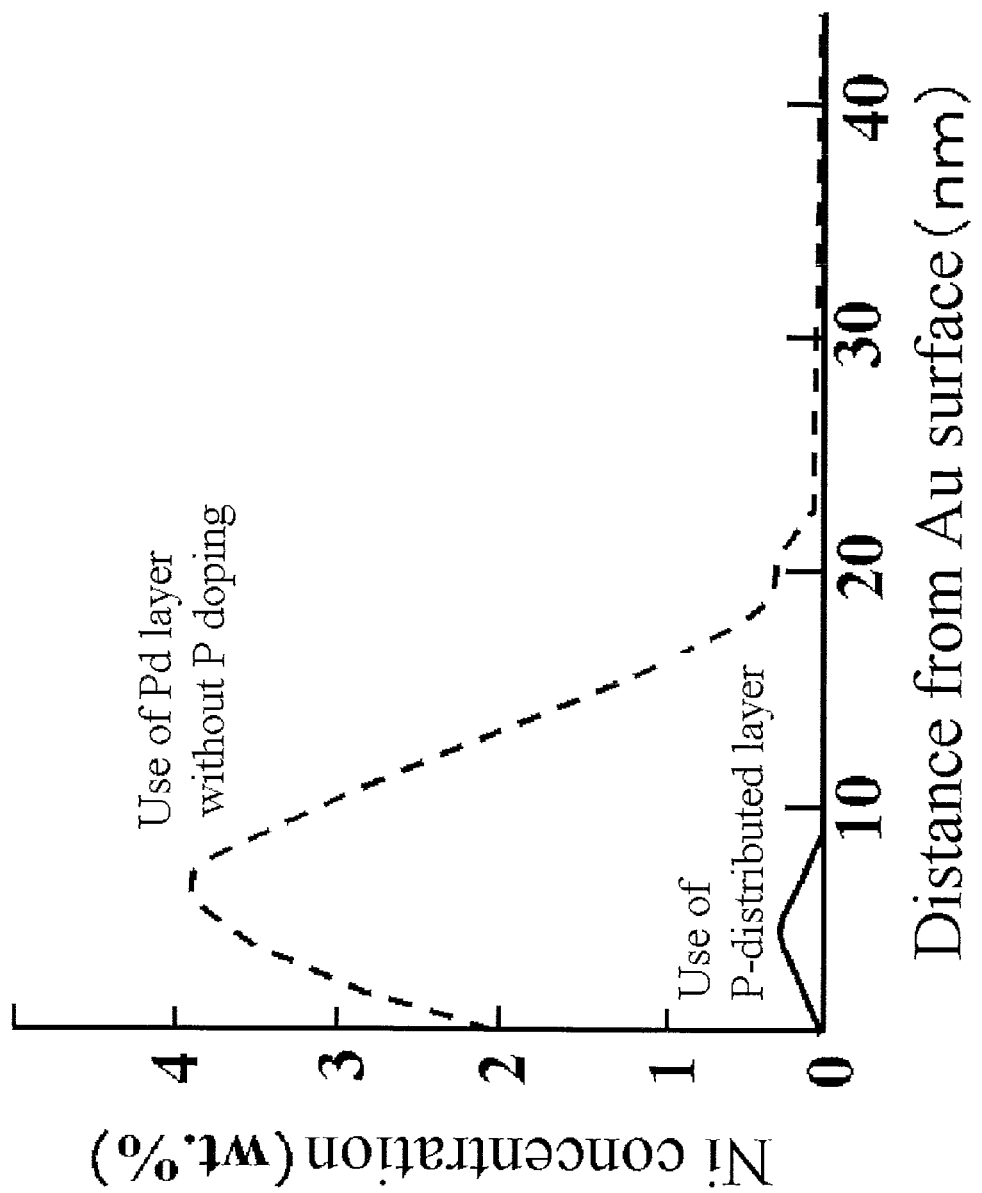
FIG. 6 shows the result from the GD-OES of the concentration profile of Ni in the electrode structure after heat treatment in the case of the present embodiment and the conventional example.
Figure 7:
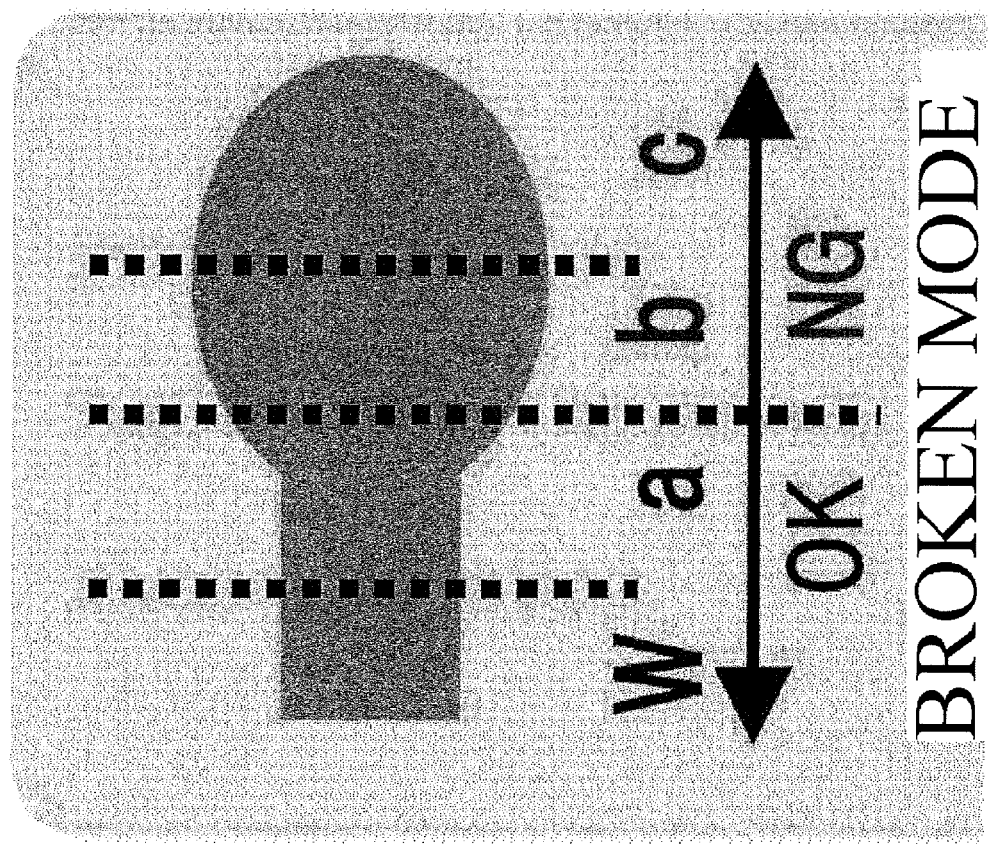
FIG. 7 is a schematic diagram of an appearance after wire bonding and a diagram showing each region defined by evaluation.
Figure 8:
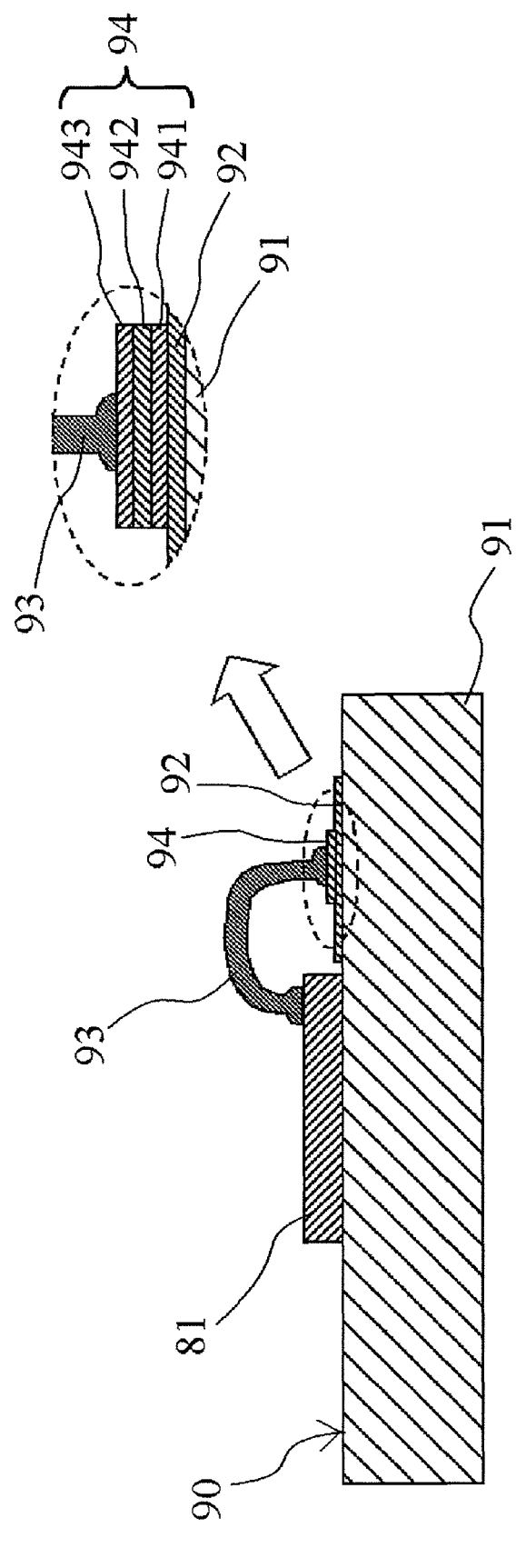
FIG. 8 is a cross-sectional view of one example of the conventional semiconductor module.
Figure 9:
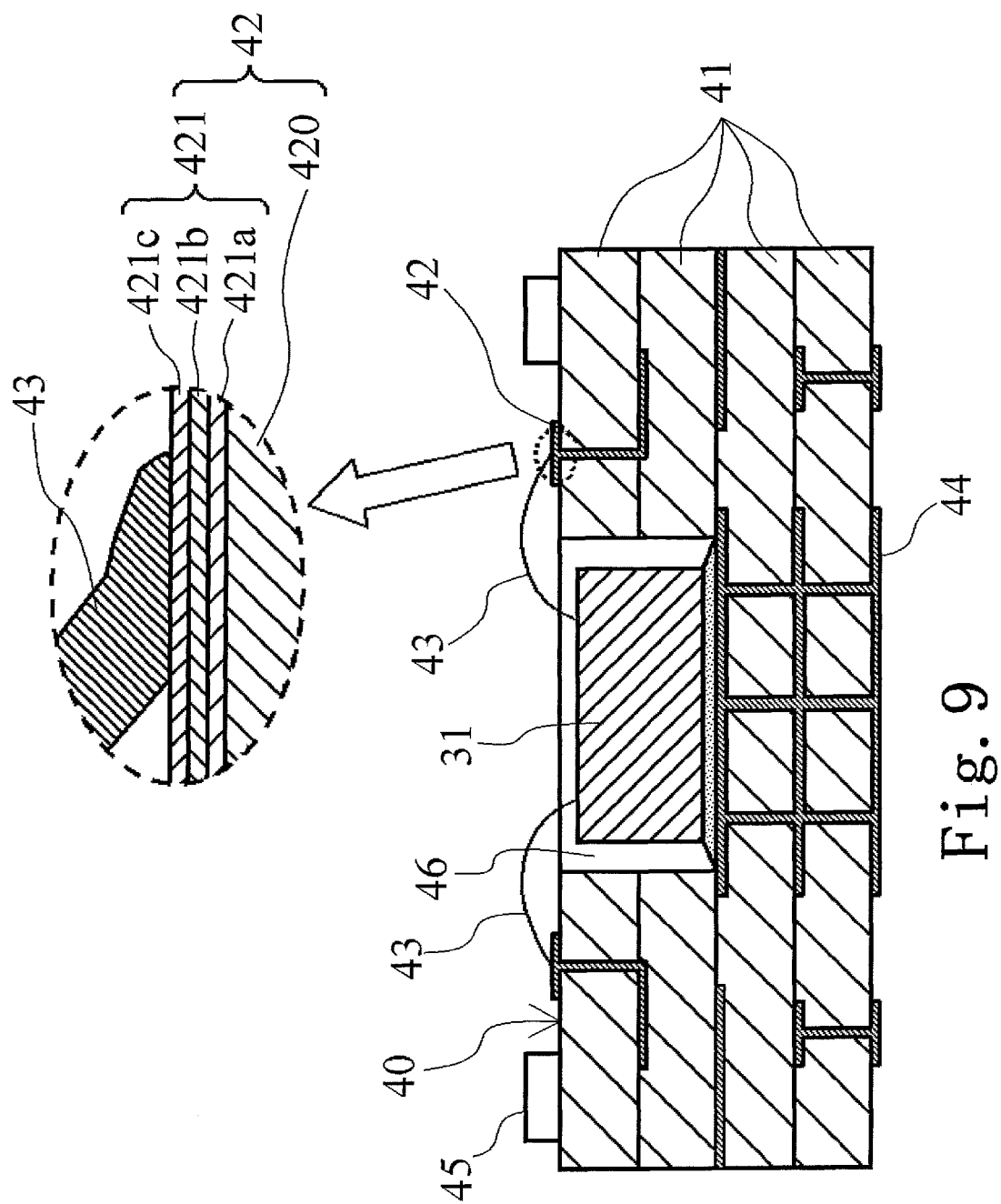
FIG. 9 is a cross sectional view of one example of a conventional high frequency component.

EXPLANATION OF NUMERALS AND CHARACTERS 10, 80: Semiconductor module, 11, 81: Semiconductor chip, 20, 90 Circuit board, 21, 91: Ceramic substrate, 22, 92: Metal circuit plate, 23, 43, 93: Bonding wire, 24, 94, 421: Coating layer, 30, High frequency electronic component, 31: semiconductor element 40: Layer stacked plate, 41: Ceramic layer, 42: Electrode (pad), 44: Conductor pattern, 45: Electronic component, 46: Cavity, 241, 941, 421a: Ni layer, 242: P-distributed Pd layer (Pd layer), 243, 943, 421: Au layer, 420: Base electrode, 421b, 942 Pd layer

The invention claimed is:

1. An electrode structure comprising:
a coating layer having a nickel (Ni) layer, a palladium (Pd) layer having phosphorous (P), and a gold (Au) layer sequentially stacked on a metal circuit plate containing Ag, wherein an average P concentration in the Pd layer is in a range of more than 2.6% by mass and not more than 6.0% by mass and wherein the P concentration on a side being in touch with the Au layer in the Pd layer is higher by 1.5% or more by mass than that on a side being in touch with the Ni layer in the Pd layer.

2. The electrode structure according to claim 1, wherein the Pd layer has an amorphous structure.

3. The electrode structure according to claim 1, wherein P has been doped to the Ni layer.

4. The electrode structure according to claim 1, wherein a thickness of the Pd layer is greater than 0.05 μm and less than or equal to 0.2 μm.

5. The electrode structure according to claim 1, wherein a thickness of the Au layer is greater than 0.05 μm and less than or equal to 0.2 μm.

6. A circuit board wherein the electrode structure according to claim 1 is formed on a ceramic substrate.

7. A semiconductor module wherein a semiconductor chip is mounted on a circuit board stated in claim 6 and the semiconductor chip is electrically connected to the electrode structure.

8. The semiconductor module according to claim 7, wherein the electrical connection is achieved by a bonding wire.

9. The semiconductor module according to claim 8, wherein a material for the bonding wire contains any one of aluminum and gold as its main ingredient.

10. The semiconductor module according to claim 8, wherein the bonding wire is connected to the electrode structure by ultrasonic bonding.

11. The electrode structure according to claim 1, wherein the Pd layer is thicker than the Au layer.

12. The electrode structure according to claim 4, wherein a thickness of the Pd layer is greater than or equal to 0.1 μm and less than or equal to 0.2 μm.

13. An electrode structure comprising:
a coating layer having a nickel (Ni) layer, a palladium (Pd) layer having phosphorous (P), and a gold (Au) layer sequentially stacked on a base electrode containing Ag, wherein an average P concentration in the Pd layer is in a range of more than 2.6% by mass and not more than 6.0% by mass and wherein the P concentration on a side being in touch with the Au layer in the Pd layer is higher by 1.5% or more by mass than that on a side being in touch with the Ni layer in the Pd layer.

14. The electrode structure according to claim 13, wherein the Pd layer has an amorphous structure.

15. The electrode structure according to claim 13, wherein P has been doped to the Ni layer.

16. The electrode structure according to claim 13, wherein a thickness of the Pd layer is greater than 0.05 μm and less than or equal to 0.2 μm.

17. The electrode structure according to claim 13, wherein a thickness of the Au layer is greater than 0.05 μm and less than or equal to 0.2 μm.

18. The electrode structure according to claim 13, wherein the Pd layer is thicker than the Au layer.

19. The electrode structure according to claim 16, wherein a thickness of the Pd layer is greater than or equal to 0.1 μm and less than or equal to 0.2 μm.

* * * * *